(12) United States Patent
Meunier-Beillard et al.

(10) Patent No.: US 7,618,858 B2
(45) Date of Patent: Nov. 17, 2009

(54) METHOD OF FABRICATING A HETEROJUNCTION BIPOLAR TRANSISTOR

(75) Inventors: Philippe Meunier-Beillard, Kortenberg (BE); Johannes J. T. M. Donkers, Valkenswaard (NL); Hijzen Erwin, Blanden (BE); Melai Joost, Enschede (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/911,620

(22) PCT Filed: Apr. 3, 2006

(86) PCT No.: PCT/IB2006/051005

§ 371 (c)(1),
(2), (4) Date: Sep. 22, 2008

(87) PCT Pub. No.: WO2006/109208

PCT Pub. Date: Oct. 19, 2006

(65) Prior Publication Data

US 2009/0075446 A1   Mar. 19, 2009

(30) Foreign Application Priority Data

Apr. 13, 2005   (EP) .................................. 05102910

(51) Int. Cl.
*H01L 21/8249* (2006.01)

(52) U.S. Cl. ............................. 438/235; 257/E29.033; 438/312

(58) Field of Classification Search ................. 438/142, 438/197, 234, 309–312; 257/E29.033
See application file for complete search history.

(56) References Cited

U.S. PATENT DOCUMENTS

| 5,001,533 | A | 3/1991 | Yamaguchi |
| 5,620,907 | A | 4/1997 | Jalali-Farahani et al. |
| 2003/0032252 | A1* | 2/2003 | Pan et al. ............. 438/312 |
| 2004/0150004 | A1 | 8/2004 | Aoki et al. |
| 2004/0155262 | A1 | 8/2004 | He et al. |
| 2005/0048735 | A1* | 3/2005 | Khater et al. ............. 438/400 |

FOREIGN PATENT DOCUMENTS

EP   0795899 A1   9/1997
WO   2005024900 A2   3/2005

* cited by examiner

*Primary Examiner*—Brook Kebede
*Assistant Examiner*—Mark A Laurenzi, III

(57) ABSTRACT

The invention provides a method for fabricating a heterojunction bipolar transistor with a base connecting region (23), which is formed self-aligned to a base region (7) without applying photolithographic techniques. Further, a collector connecting region (31) and an emitter region (29) are formed simultaneously and self-aligned to the base connecting region (23) without applying photolithographic techniques.

6 Claims, 4 Drawing Sheets

METHOD OF FABRICATING A HETEROJUNCTION BIPOLAR TRANSISTOR

Figure 1:
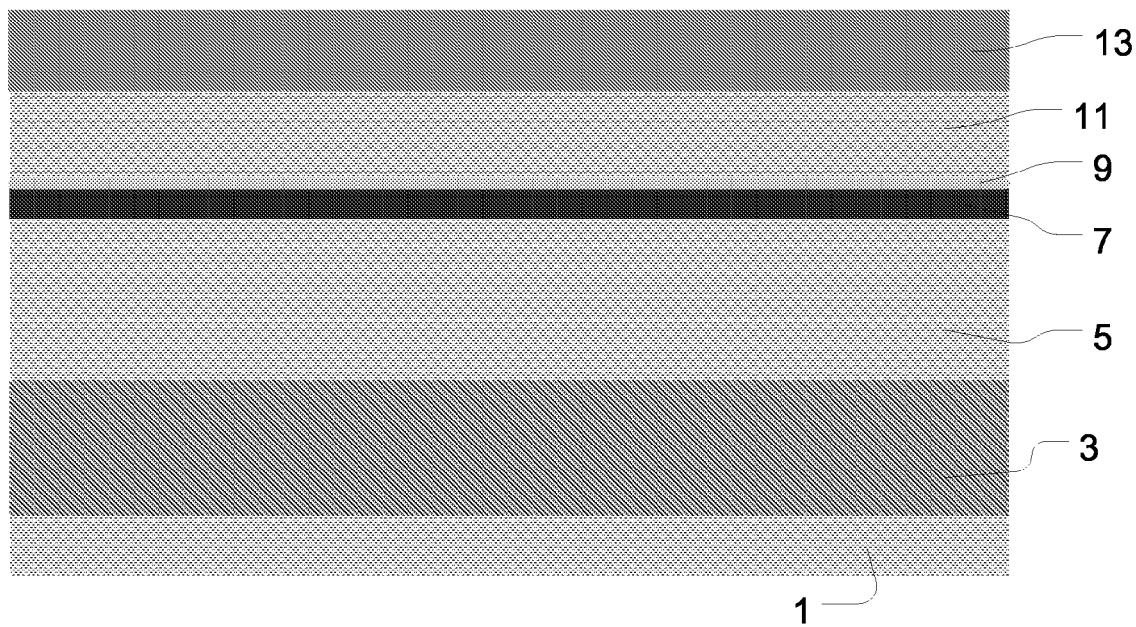

This invention relates to a method of fabricating a heterojunction bipolar transistor.

U.S. Pat. No. 5,001,533 discloses a method of fabricating a bipolar transistor in which a columnar region is formed comprising a collector, a base and an emitter region. A contact to the base region, which comprises mono-silicon, is provided by forming a base connecting region adjacent to the base region using deposition and photolithographic techniques. A contact to the emitter region is provided by depositing a polysilicon layer, followed by patterning the polysilicon layer using photolithographic and etching techniques. This method of fabricating a bipolar transistor requires a large number of fabrication steps and further includes many photolithographic steps, which influences the performance of the thus fabricated bipolar transistor in a negative way.

It is an object of the invention to provide a method for fabricating a heterojunction bipolar transistor with a relatively small number of photolithographic steps. According to the invention, this object is achieved by the method as claimed in claim 1.

This fabrication method provides a protrusion or a columnar region on a first collector region of a first semiconductor material on a semiconductor substrate, the protrusion having sidewalls and comprising a portion of the first collector region, a base region of a second semiconductor material and a sacrificial region of a third semiconductor material. On the sidewalls of the protrusion a base connecting region of the second semiconductor material is formed self-aligned to the base region. Thereafter said sacrificial region is removed, thereby creating a space region, which is surrounded by the base connecting region, followed by forming insulating spacers on the base connecting region in the space region. Thereafter a sacrificial layer of a fourth semiconductor material is deposited which fills the space region and covers the base region, the base connecting region and the spacers. The sacrificial layer is partly removed such that a portion of the base connecting region is exposed, thereby forming a self-aligned emitter region of the fourth semiconductor material. The emitter region has an electrical contact to the base region and is isolated from the base connecting region by the spacers.

The base connecting region is formed self-aligned to the base region without applying photolithographic techniques. Further, the emitter region is formed without applying photolithographic techniques, thereby achieving a complete self-alignment of the emitter region with respect to the base region and the base connecting region, whereas the prior art requires an extra patterning step to form the emitter region.

The sacrificial layer may be advantageously used to form, simultaneously with the forming of the emitter region, a collector electrode on a portion of the first collector region which is adjacent to the protrusion and which is isolated from the base connecting region by further spacers.

The base to collector capacitance may be advantageously reduced by forming an insulation region, which is covered by a portion of the further spacers and a portion of the base connecting region.

The collector resistance may be advantageously reduced by providing dopant atoms to the portion of the first collector region, which is adjacent to the protrusion.

These and other aspects of the invention will be further elucidated and described with reference to the drawings, in which:

FIGS. 1-7 illustrate various stages of the fabrication of a heterojunction bipolar transistor according to an embodiment of the invention.

The Figures are not drawn to scale. In general, identical components are denoted by the same reference numerals in the Figures.

FIG. 1 illustrates an initial structure of an embodiment comprising a semiconductor substrate 1, a heavily doped n-type sub-collector region 3, an n-type doped first collector region 5, a base region 7, an etch stop layer 9, a sacrificial layer 11 and a hard mask layer 13. The sacrificial layer 11 comprises a material that can be removed selectively with respect to the etch stop layer 9 and the to be fabricated base connecting layer, for example the sacrificial layer 11 may comprise n-type silicon and the etch stop layer 9 SiGe. The layers 3, 5, 7, 9 and 11 may be formed with one epitaxial growth step, thereby reducing the number of fabrication steps. The hard mask layer 13, which may comprise silicon nitride, may be formed by applying a standard deposition technique.

Figure 2:
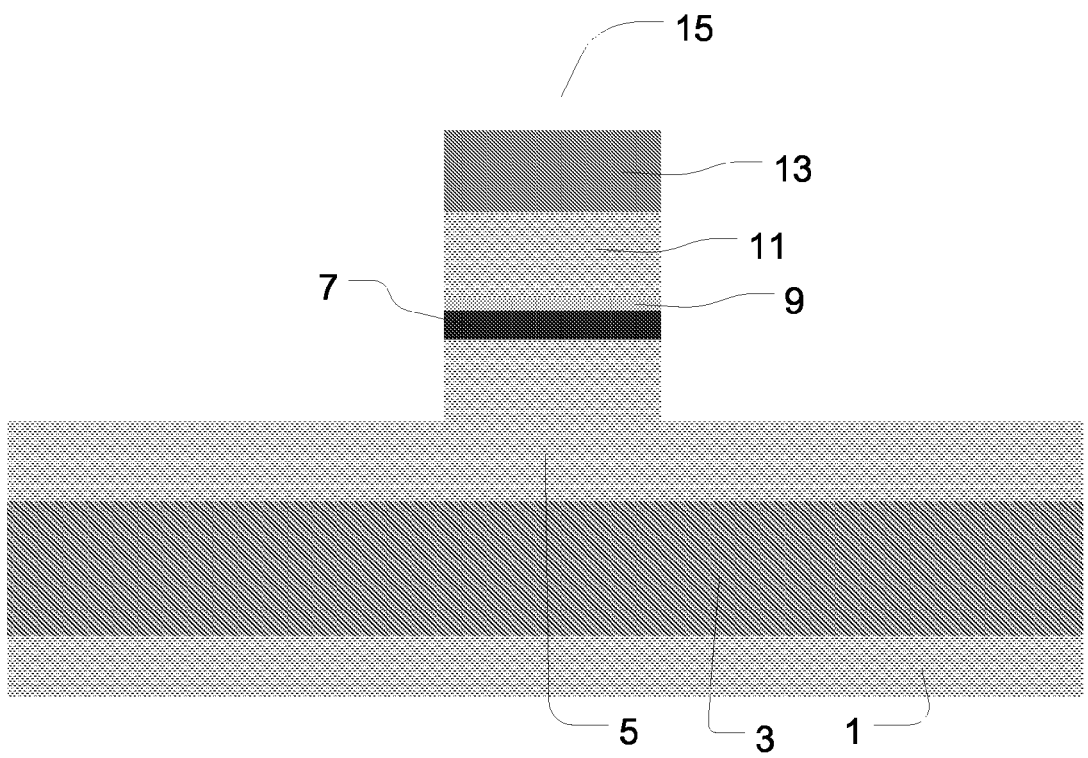

As is illustrated in FIG. 2, the hard mask layer 13 is used to form a protrusion 15 with photolithographic and dry etching techniques. The etching process is stopped when both the thus formed protrusion 15 comprises a portion of the first collector region 5, and the region adjacent to the protrusion 15 exposes a portion of the first collector region 5. Thus, at this point the protrusion 15 comprises the hard mask layer 13, the sacrificial layer 11, the etch stop layer 9, the base region 7, and a portion of the first collector region 5.

Figure 3:
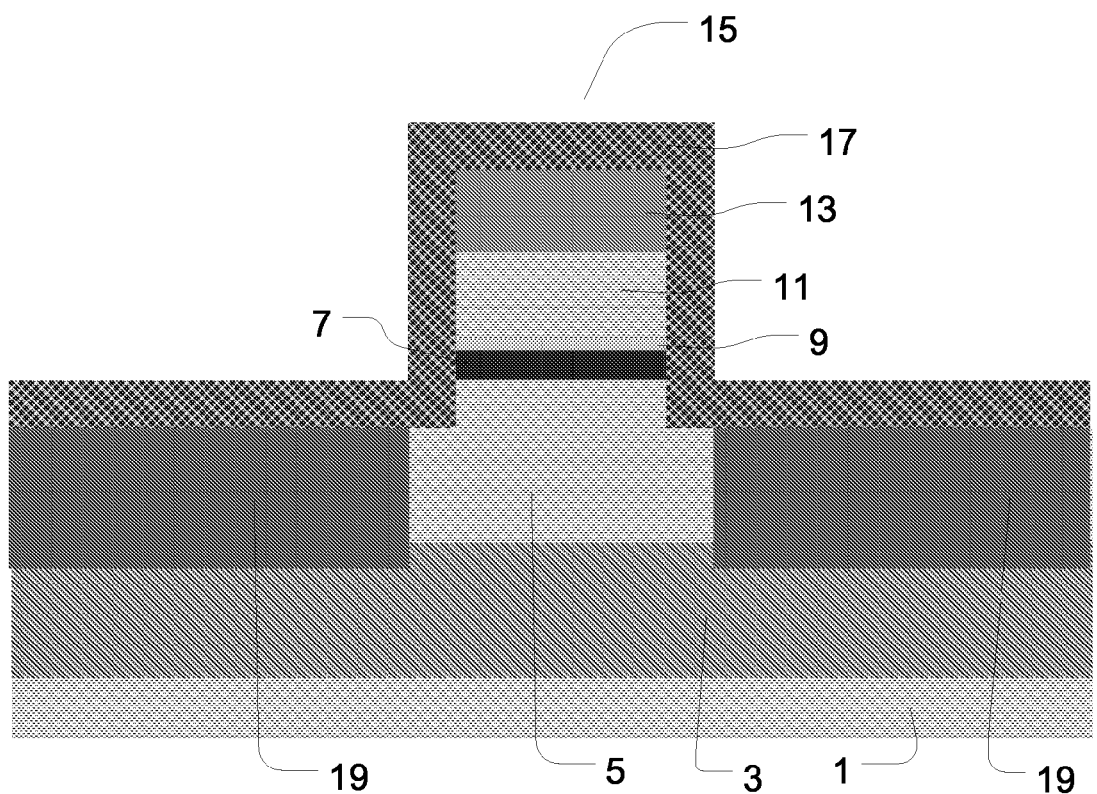

Then, as is illustrated in FIG. 3, a portion of the first collector region 5, which is adjacent to the protrusion 15, may be implanted with an n-type dopant, such as arsenic, thereby forming a second collector region 19, which is a low resistive path that is electrically connected to the first collector region 5. Before this n-type implant a silicon nitride layer 17 may be deposited, which enables a clearance of the second collector region 19 with respect to the protrusion 15 and hence the base region 7. After the n-type implant, the silicon nitride layer 17 may be removed with a wet etching step.

Figure 4:
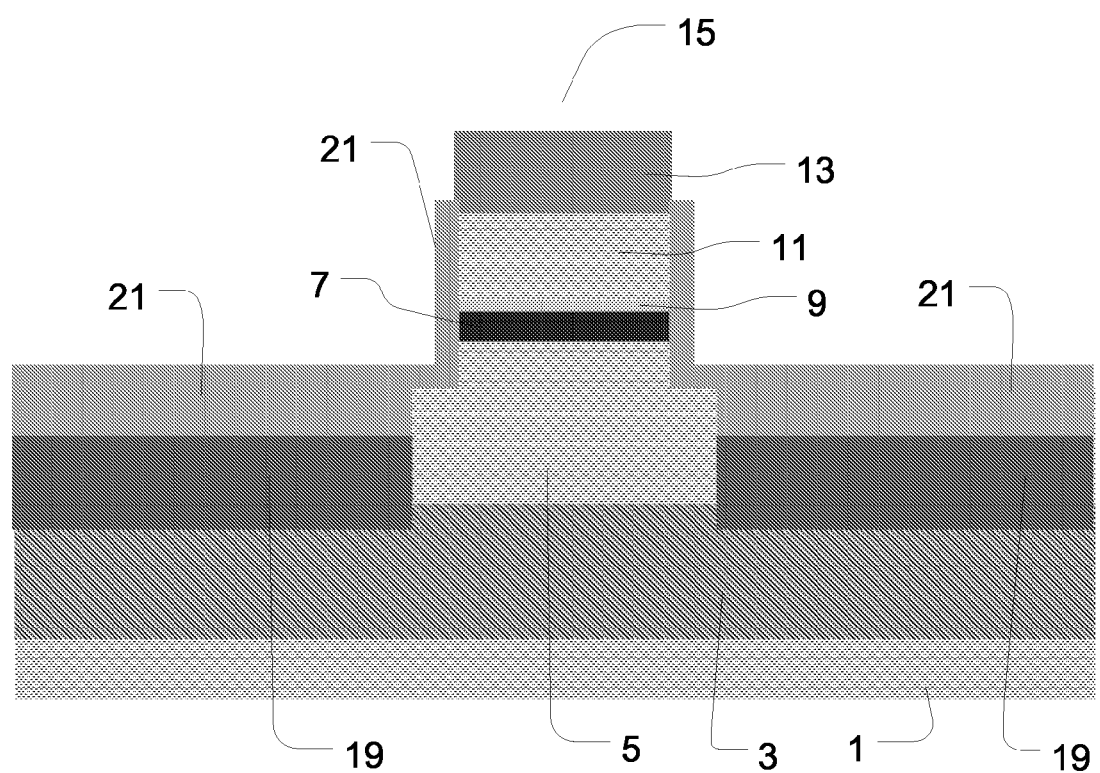

Next, a silicon dioxide layer 21 is grown on the exposed regions using a wet oxidation step. As is illustrated in FIG. 4, the silicon dioxide layer 21 is not formed on the hard mask layer 13 and comprises a relatively thick portion on the second collector region 19 and a relatively thin portion in on the other regions, because the second collector region 19 contains a higher doping level, and hence a higher oxidation rate, than the other regions.

Figure 5:
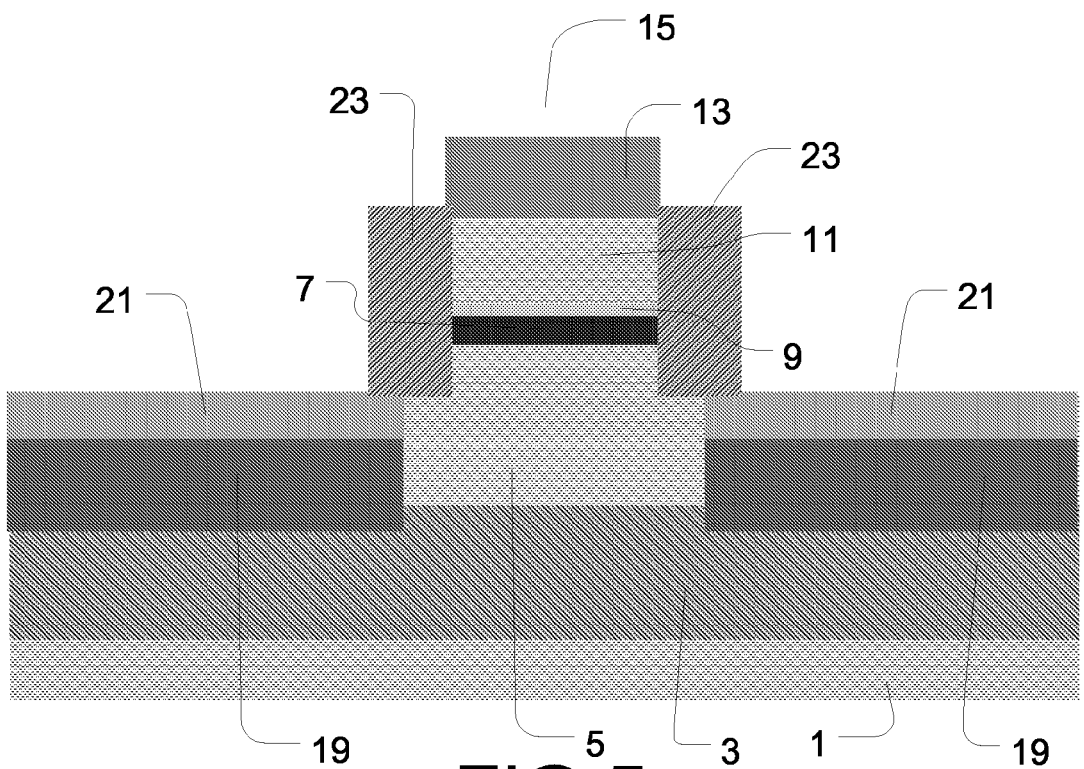

Thereafter a HF-based wet etching step removes the thin portion of the silicon dioxide layer 21, while a portion of the relatively thick portion of the silicon dioxide layer 21 on the second collector region 19 is not removed, as is illustrated in FIG. 5. A p+-doped SiGe layer is formed on the sidewalls of the protrusion 15, which expose silicon and SiGe, using selective epitaxial growth with respect to the silicon dioxide layer 21 and the hard mask layer 13. With this method a base connecting region 23 is formed without applying photolithographic techniques, the base connecting region 23 having an outer sidewall, an inner sidewall and a top surface and providing an electrical connection to the base region 7.

Figure 6:
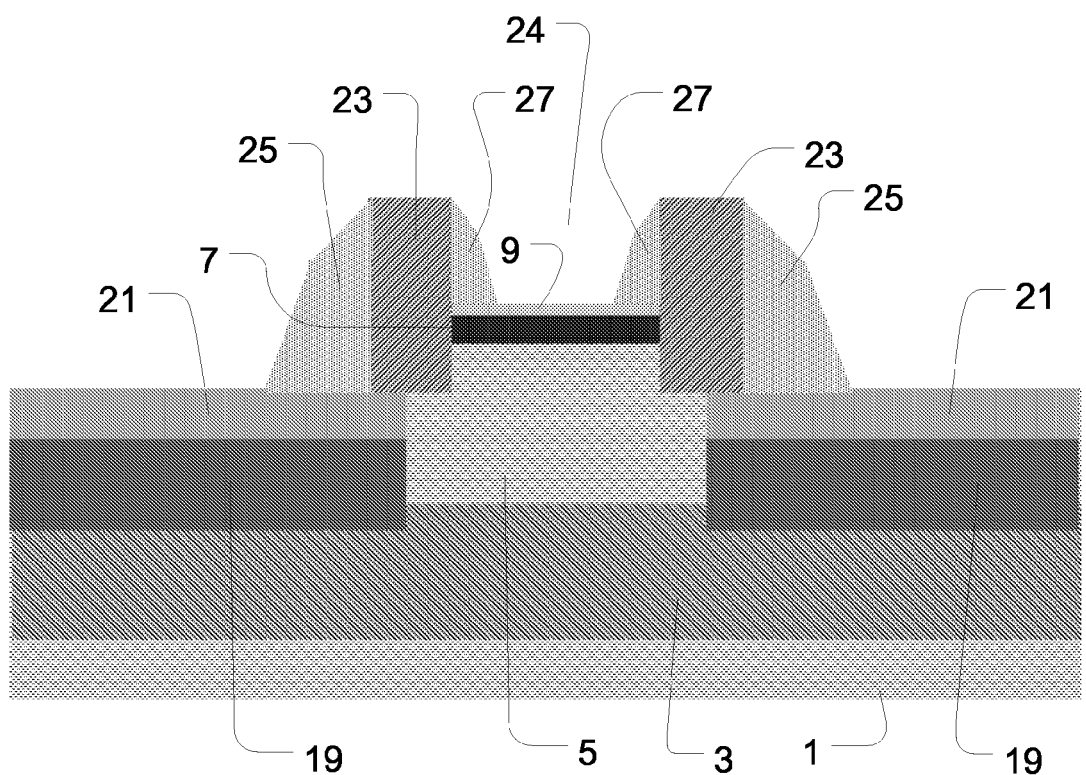

Next, the hard mask layer 13 is removed with an etching step. Thereafter, as is illustrated in FIG. 6, the sacrificial layer 11 is removed with an etching step, thereby creating a space region 24 which comprises a bottom, which exposes the base region 9, and a sidewall, which exposes a portion of the inner sidewall of the base connecting region 23. The sacrificial layer 11 comprises a material that enables a removal of the sacrificial layer 11 selectively with respect to the etch stop layer 9 and the base connecting region 23. In this case the sacrificial layer 11 may comprise n-type silicon, the etch stop layer 9 and the base connecting region 23 may comprise SiGe, but also other materials may be applied as long as the selective removal of the sacrificial layer 11 with respect to the etch stop layer 9 and the base connecting region 23 is possible. The etch stop layer 9 may be removed, however, this layer may also be a part of the base region 7, and, in that case, does not need to be removed. Further, FIG. 6 illustrates that inside spacers 27 and outside spacers 25 are formed, using standard spacer forming techniques. The inside spacers 27 cover the sidewalls of the spacer region 24, which is the exposed portion of the inner sidewall of the base connecting region 23. The outside spacers 25 cover the outer sidewall of the base connecting region 23. The inside spacers 27 and the outside spacers 25 comprise an insulating material, such as silicon nitride, and preferably have a D-sized shape, but any other shape may also be applied.

Figure 7:
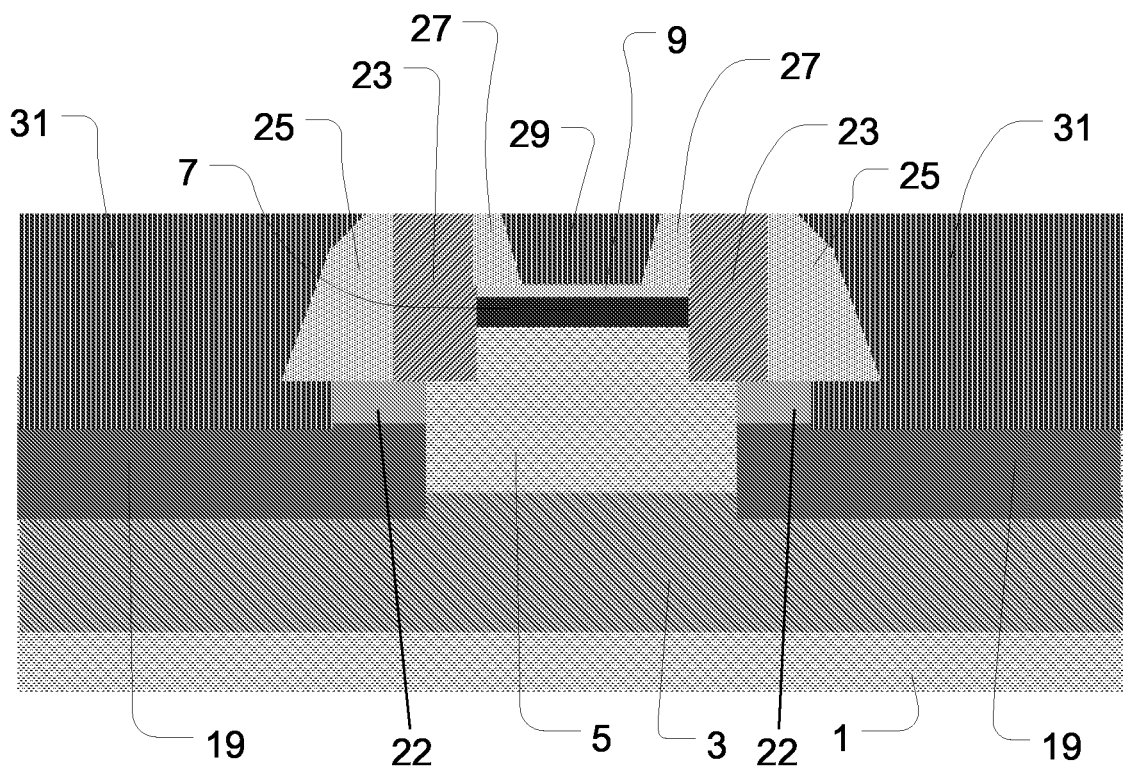

Thereafter, the remaining portion of the relatively thick portion of the silicon dioxide layer 21 on the second collector region 19 is removed using for example a wet etch. As is illustrated in FIG. 7, an n-type polysilicon layer is deposited, followed by a planarization of the surface, using for example Chemical Mechanical Polishing, thereby exposing the top surface of the base connecting region 23 and splitting the n-type polysilicon layer into two regions that are not connected, a collector connecting region 31 adjacent to the outside spacers 25, and an emitter region 29 adjacent to the inside spacers 27. With this method a collector connecting region 31 and an emitter region 29 are formed simultaneously with one fabrication step and fully self-aligned to the base connecting region 23, without applying photolithographic techniques.

In summary, the invention provides a method for fabricating a heterojunction bipolar transistor with a base connecting region, which is formed self-aligned to a base region without applying photolithographic techniques. Further, a collector connecting region and an emitter region are formed simultaneously and self-aligned to the base connecting region without applying photolithographic techniques.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A method for fabricating a heterojunction bipolar transistor, the method comprising:

providing a protrusion on a first collector region of a first semiconductor material, the protrusion having a sidewall and comprising a portion of the first semiconductor material, a base region of a second semiconductor material and a sacrificial region of a third semiconductor material, of forming a base connecting region of the second semiconductor material on the sidewall of the protrusion, the base connecting region having a top surface and an outer sidewall, selectively removing the sacrificial region relative to the base region and the base connecting region, thereby forming a space region with a sidewall comprising a portion of the base connecting region and a bottom comprising the base region;

forming spacers of an insulating material covering the sidewall of the space region;

depositing a sacrificial layer of a fourth semiconductor material filling the space region and covering the spacers, the base connecting region and the base region, and partly removing the sacrificial layer to expose the top surface of the base connecting region thereby forming an emitter region in the space region comprising the fourth semiconductor material.

2. The method as recited in claim 1, wherein forming spacers further includes covering the outer sidewall of the base connecting region, wherein depositing a sacrificial layer further includes depositing the sacrificial layer on the first collector region adjacent to the protrusion, and wherein partly removing the sacrificial layer further includes forming a collector connecting region adjacent to the protrusion and comprising the fourth semiconductor material.

3. The method as recited in claim 2, wherein providing a protrusion on a first collector region further includes, forming an insulation layer on the first collector region adjacent to the protrusion, before depositing the sacrificial layer on the first collector region adjacent to the protrusion: partly removing the insulation layer to expose the first collector region adjacent to the protrusion thereby forming an insulation region which is covered by a portion of the further spacers and a portion of the base connecting region.

4. The method as recited in claim 2, wherein providing a protrusion on a first collector region further includes, providing dopant atoms to a portion of the first collector region adjacent to the protrusion thereby forming a second collector region.

5. The method as recited in claim 1, wherein the base region comprises a multi-layer of intrinsic SiGe:C, p-type doped SiGe:C, intrinsic SiGe:C, p-type doped Si and SiGe, and the base connecting region comprises p-type doped SiGe.

6. The method as claimed in claim 1, wherein the sacrificial layer comprises n-type doped polysilicon.

* * * * *